United States Patent [19]
Park

[11] Patent Number: 5,576,639
[45] Date of Patent: Nov. 19, 1996

[54] BICMOS LEVEL SHIFTER OF A SEMICONDUCTOR INTEGRATED CIRCUIT AND DATA OUTPUT BUFFER USING THE SAME

[75] Inventor: Chul-Sung Park, Ahnsan, Rep. of Korea

[73] Assignee: Samsung Electronics Co., Ltd., Suwon, Rep. of Korea

[21] Appl. No.: 368,793

[22] Filed: Jan. 4, 1995

[30] Foreign Application Priority Data

Jan. 14, 1994 [KR] Rep. of Korea .................. 619/1994

[51] Int. Cl.⁶ ................................................. H03K 19/08
[52] U.S. Cl. ............................... 326/66; 326/84; 326/110
[58] Field of Search .................................. 326/66, 58, 27, 326/84, 110, 83, 121, 73; 327/53, 433

[56] References Cited

U.S. PATENT DOCUMENTS 4,791,324  12/1988  Hodapp ..................................... 327/53
4,847,522  7/1989   Fuller et al. ............................... 326/84
5,132,568  7/1992   Kim et al. ................................. 326/110
5,132,569  7/1992   Matsuda ................................... 326/110
5,304,869  4/1994   Greason ..................................... 326/66
5,311,075  5/1994   Usuki ........................................ 326/66

Primary Examiner—Edward P. Westin
Assistant Examiner—Benjamin D. Driscoll
Attorney, Agent, or Firm—Cushman Darby & Cushman, L.L.P.

[57] ABSTRACT

The present invention provides BICMOS level shifter having pull-up and/or pull-down transistors at pull-up and/or pull-down portions, which perform a switching operation in response to a reference signal of a stable voltage level, and a BICMOS data output buffer employing the BICMOS level shifters as respective pull-up and pull-down control circuits. Thereby, it is possible to attain low power consumption, high drive capability and high speed operation by bipolar transistors and is also possible to cope with unstable signals.

22 Claims, 7 Drawing Sheets

BICMOS LEVEL SHIFTER OF A SEMICONDUCTOR INTEGRATED CIRCUIT AND DATA OUTPUT BUFFER USING THE SAME

BACKGROUND OF THE INVENTION

1. Field of the Invention

The present invention relates to a semiconductor integrated circuit, and particularly to a BICMOS level shifter for changing an emitter coupled logic(ECL) signal to a CMOS logic signal or a bipolar logic signal, and a data output buffer using the same.

2. Description of the Related Arts

As semiconductor integrated circuits become more highly integrated and of higher speed, signal noise problems increase. One of the significant signal noises in semiconductor integrated circuits is the noise generated from the data output driver of the data output buffer when read-out data from a predetermined memory cell is supplied off-chip from the data output buffer via an I/O line sense amplifier. The reason for this noise is that data output driver transistors buff the internal and external impedance of the chip and have a considerably wide channel width as compared to the other components in the chip in order to allow for high speed data access operations when a predetermined output operation (namely, at the swing operation from a "high" level to a "low" level or from the "low" level to the "high" level) starts, a large amount of current flows, which generates excessive consumption current. Particularly, ground noise is a problem since it gets applied to circuits in which the ground voltage is supplied to the source voltage. This is also true for Vcc noise.

As compared to the MOS transistor, the bipolar transistor can operate at a higher speed and have greater drive capability. Therefore, bipolar transistors are preferred components for output circuitry.

To solve the above problems, a predetermined current control circuit is provided in the pull-up or pull-down portions of the data output driver of the data output buffer. U.S. Pat. No. 4,636,665 teaches one example of this particular technique in which bipolar transistors are used in order to achieve the high speed operation and high drive capability. This technique discloses an inverter-type BICMOS level shifter, that is, a BICMOS data output buffer, which uses respective NPN-type bipolar transistors at the pull-up and pull-down portions and MOS transistors for controlling the NPN-type bipolar transistors. The above-described application has a feature which makes it possible to secure high drive capability during a data output operation and to perform the current transfer operation at a high speed by utilizing the feature of the bipolar transistors. However, due to the low drive capability of the MOS transistor driving the bipolar transistor, the high speed operation of the BICMOS data output buffer is limited. That is, the time required in driving the bipolar transistor of the data output driver is limited by the low drive capability of the MOS transistor. In this case, if the MOS transistor controlling the bipolar transistor is enlarged to improve the high speed operation and the drive capability, there may occur a problem that the amount of direct current is increased, and power consumption is thereby undesirably increased.

In order to overcome the above problem, the present inventor proposed an improved technique in Korean patent No. 92-9671 (entitled "BICMOS LEVEL SHIFTER"). This improved technique provides an input circuit which is constructed in the form of a differential amplifier having MOS transistors and a data output driver which uses a bipolar transistor. The data output driver further comprises a pull-down portion including a MOS transistor, thereby solving the problem of instability of the output signal by the inter-switching operation of the pull-down bipolar transistors as well as enhancing drive capability and high speed operation. However, because it is impossible to control the unstable input of the control signals A and B supplied to the input circuit of the level shifter, a direct current is continuously generated and results in a large power consumption. In addition, the speed of the data output operation is lowered by the loading capacitance formed in the data output driver.

SUMMARY OF THE INVENTION

It is therefore an object of the present invention to provide a BICMOS level shifter which is capable of performing high speed operation and having a high drive capability.

It is another object of the present invention to provide a BICMOS level shifter which suppresses power consumption at its maximum while improving high speed operation and drive capability.

It is another object of the present invention to provide a BICMOS level shifter capable of coping with unstable input of an ECL level signal.

It is still another object of the present invention to provide a BICMOS data output buffer which suppresses power consumption at its maximum while improving high speed operation and drive capability.

It is further still another object of the present invention to provide a BICMOS level shifter which is capable of performing a high speed data output operation with low electric power regardless of an unstable input control signal, and a data output buffer utilizing the same.

In carrying out the above and other objects of the present invention, the BICMOS level shifter is constructed to have pull-up and/or pull-down transistors at pull-up and/or pull-down portions, which perform a switching operation in response to the input of a reference signal having a stable voltage level.

In addition, the BICMOS level shifter according to the present invention is enabled only by an ECL level input signal and suppresses the generation of the direct current flowing from a power supply voltage to ground.

Further, the BICMOS data output buffer according to the present invention outputs a predetermined data in response to the driving of respective bipolar transistors and comprises the BICMOS level shifter of the present invention at the pull-up and/or pull-down portions.

BRIEF DESCRIPTION OF THE DRAWINGS

In the detailed description of the preferred embodiments of the present invention presented below, reference is made to the accompanying drawings, in which.

DETAILED DESCRIPTION OF THE PREFERRED EMBODIMENT

The term "BICMOS level shifter" as used herein, indicates a shifter that inputs an ECL level signal and then outputs a MOS logic signal or a bipolar logic signal, but is not limited to circuits using such signals as described further hereinafter. In addition, "and/or" used herein means both "and" and "or". It is assumed that signals A and B are the ECL level signals in the following description.

Figure 1:
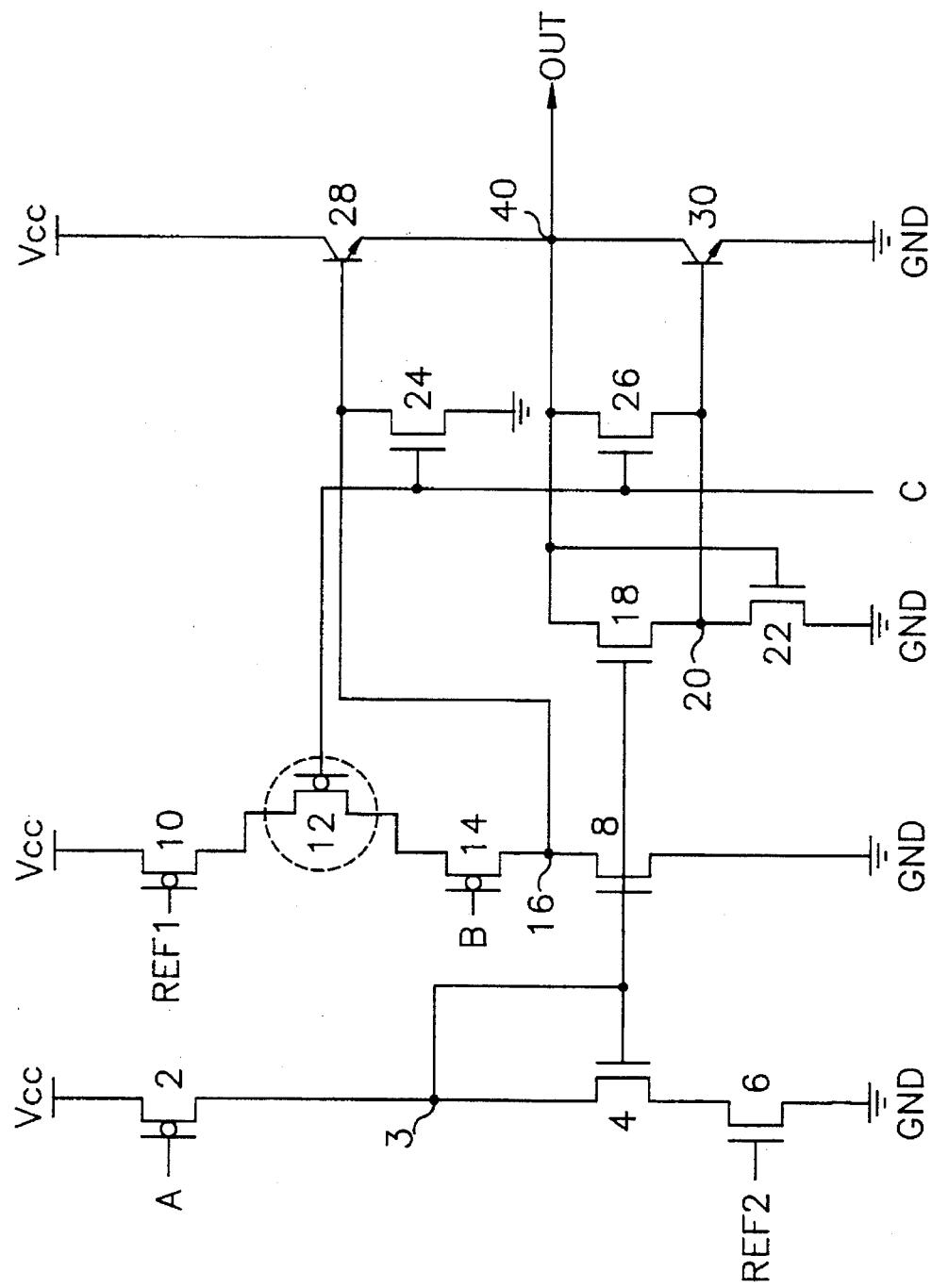
FIG. 1 is a circuit diagram showing a first embodiment of a BICMOS level shifter according to the present invention.

FIG. 1 is a circuit diagram showing a first embodiment of a BICMOS level shifter according to the present invention. Between a power supply voltage Vcc and ground GND, a PMOS transistor 2 and NMOS transistors 4 and 6 are serially connected one to another. A first control signal A is applied to a gate of the PMOS transistor 2. A second reference signal REF2 is applied to a gate of the NMOS transistor 6. Between the power supply voltage Vcc and the ground GND, PMOS transistors 10,12,14 and an NMOS transistor 8 are serially connected one to another. A first reference signal REF1 is applied to a gate of the PMOS transistor 10. A second control signal B is applied to a gate of the PMOS transistor 14. A third control signal C is applied to a gate of the PMOS transistor 12. NMOS transistors 4 and 8 are commonly connected to a connection node 3 which is a common terminal of the PMOS transistor 2 and NMOS transistor 4. Between the power supply voltage Vcc and the ground GND, the channels of NPN-type bipolar transistors 28 and 30 are serially connected one to another. A connection node 40 of the transistors 28 and 30 serves as an output node of the BICMOS level shifter. The base of the bipolar transistor 28 is connected to a common connection node 16 of the PMOS transistor 14 and NMOS transistor 8. The base of the bipolar transistor 28 is also connected to a pull-down NMOS transistor 24 having its gate coupled to the third control signal C. Between the output node 40 and the ground GND, NMOS transistors 18 and 22 are serially connected one to another. The gate of the NMOS transistor 18 is coupled to the connection node 3. The gate of the NMOS transistor 22 is coupled to the output node 40. The base of the NPN-type bipolar transistor 30 is connected to a common connection node 20 of the serially connected NMOS transistors 18 and 22. AN NMOS transistor 26 having its gate connected to the third control signal C is formed between the output node 40 and the connection node 20. As can be seen from this construction, FIG. 1 is designed in the form of a NOR logic circuit.

The characteristics of the control signals A, B and C are as follows. The signals A and B serve as the input signals and as the control signals of the transistors 2 and 14. These signals can be, for example, obtained by amplifying cell data through a sense amplifier or can be a desired input signal. Control signal C can be generated by decoding addresses or by a chip enable signal $\overline{CE}$ or a row address strobe signal $\overline{RAS}$ or a column address strobe signal $\overline{CAS}$.

The reference signals REF1 and REF2 maintain a constant difference to take into account variations in voltage of the external power supply and temperature change. The output signal of a reference voltage generating circuit disclosed in an article entitled "Variable Vcc Design Techniques for Battery Operated DRAMs", which appeared in the 1992 Symposium on VLSI Circuits Digest of Technical Papers, pp 110–111, can be used as reference signals REF1 and REF2, and the voltage level thereof is around ½ Vcc or Vcc−nVth(n=0,1,2,3...). These signals constantly maintain the gate-source voltage Vgs of transistors regardless of the variation of Vcc, reduce unnecessary power consumption and minimize noise.

The output signal OUT obtained from the first, second and third control signals A, B and C is eventually output as a NOR logic circuit output. Thus, enable or disable states of the BICMOS level shifter is determined by the control signal C. The signal OUT from the output node 40 becomes "high" only when the third control signal C is a "low" level and the level of the first control signal A is higher than that of the second control signal B. To overcome the conventional problem of BICMOS level shifters, FIG. 1 is designed to have transistors 6 and 10 controlled by respective reference signals REF2 and REF1 at the pull-up and pull-down portions. These transistors can make the connection nodes 3 and 16 operate stably regardless of the input stability of signals A and B. This is because the reference signals REF1 and REF2 having a constant voltage level can stably control the channel current. Hence, the stability of the connection node 3 and 16 results in the stable output of the signal OUT.

In FIG. 1, respective transistors band 10 controlled by the reference signals having the constant voltage level are formed at the pull-up portion as well as at the pull-down portion. If necessary, it is possible to provide one such transistor at either the pull-up or pull-down portion. However, it is preferred that respective transistors are provided both at the pull-up and pull-down portions as shown in FIG. 1.

Figure 2:
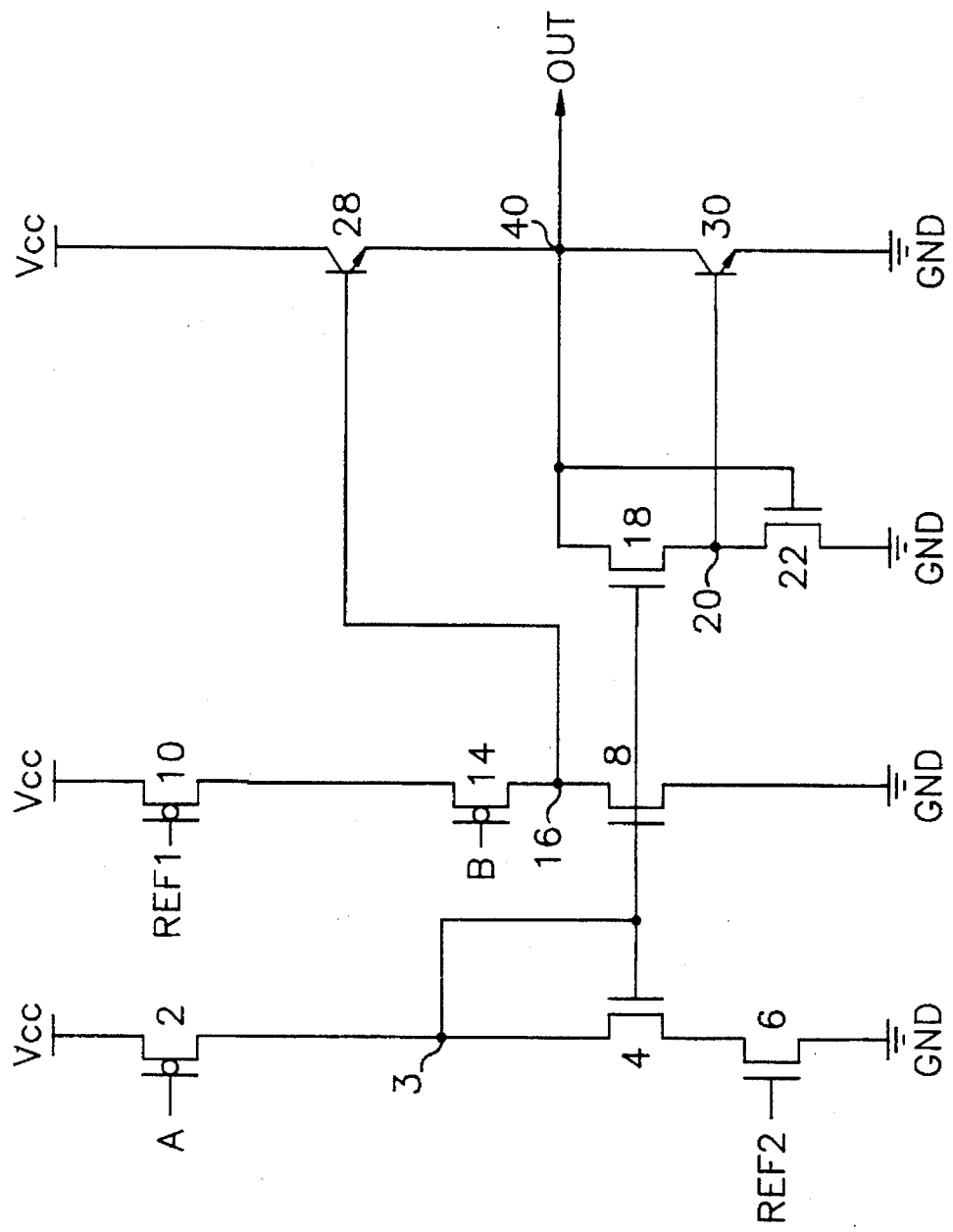
FIG. 2 is a circuit diagram showing a second embodiment of the BICMOS level shifter according to the present invention.

FIG. 2 is a circuit diagram showing a second embodiment of the BICMOS level shifter according to the present invention. As compared to FIG. 1, FIG. 2 does not have the third control signal C and the transistors 12, 24 and 26 controlled by the control signal C. Thus, the BICMOS level shifter of FIG. 2 performs its logic operation as an inverter. In the same way as FIG. 1, FIG. 2 is constructed to have at the pull-up and pull down portions the transistors controlled by the reference signals having the constant voltage level, namely, the pull-down transistor 6 controlled by the reference signal REF2 and the pull-up transistor 10 controlled by the reference signal REF1. With this construction, it is possible to improve the high drive capability and high speed data output operation through the differential amplifying construction of the input circuit containing transistors 2, 4, 6, 8, 10 and 14, and to perform a stable driving operation by the pull-down and pull-up transistors 6 and 10.

Figure 3:
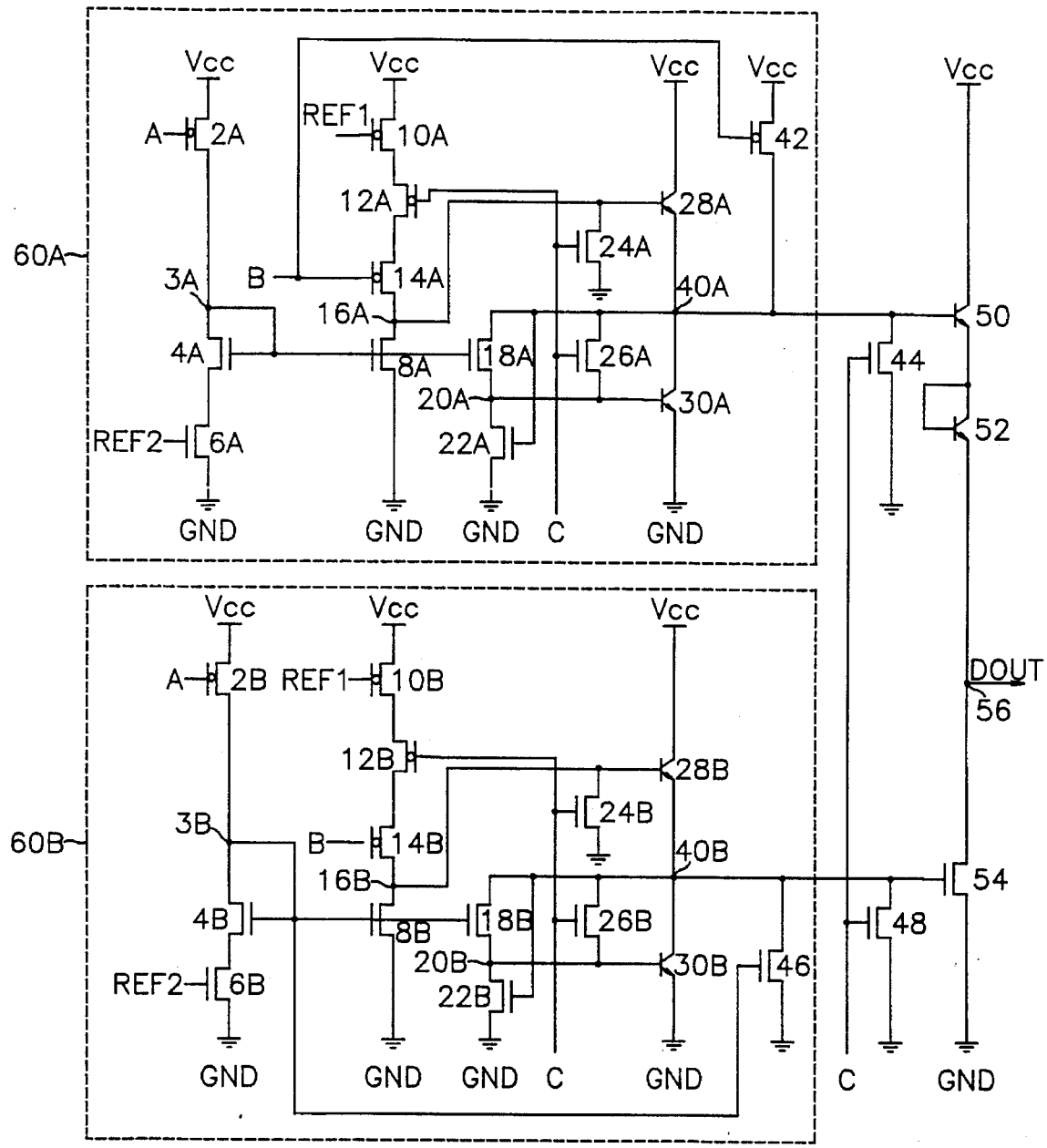
FIG. 3 is a circuit diagram showing an embodiment of a data output buffer utilizing the BICMOS level shifter according to the present invention.

FIG. 3 is a circuit diagram showing a preferred embodiment of a data output buffer using the BICMOS level shifter of FIG. 1. In FIG. 3, the same components as those in FIG. 1 have the same reference numerals. FIG. 3 is constructed to have respective BICMOS level shifters 60A and 60B for controlling the pull-up bipolar transistor 50 and pull-down MOS transistor 54 of a data output driver. The emitter of the pull-up bipolar transistor 50 is connected to another bipolar transistor 52. The common terminal of the bipolar transistor 52 and MOS transistor 54 is the output node 56 of the data output buffer. The output node 56 is connected to a data output PAD or a data output PIN.

Operation of the BICMOS data output buffer according to the present invention will now be described with reference to FIG. 3. Switching operation of the pull-up bipolar transistor 50 or pull-down MOS transistor 54 is determined by the difference between the levels of the first and second control signals A and B. Thus, the output node 56 is maintained at a Vcc−50+52=2 level in a pull-up mode and a GND level in a pull-down mode. In the same way as the NOR-type BICMOS level shifter of FIG. 1, the base of the pull-up bipolar transistor 50 or the gate of the pull-down MOS transistor 54 is charged or discharged according to the voltage level of the first, second and third control signals A, B and C, thereby determining the voltage level at the output node 56.

A PMOS transistor 42 is connected to the gate of a PMOS transistor 14A with the signal B is connected thereto. Hence, if the base of the pull-up bipolar transistor 50 is a "high" level, the output voltage Vcc−Vbe is precharged to Vcc, thereby being the "high" data output voltage VOH>2.4 V. A NMOS transistor 46 is connected to a connection node 3B, to make the gate voltage of the pull-down MOS transistor 54 be discharged to GND. Thereby a stable operation can be performed.

To maintain the BICMOS data output buffer of the present invention as a tri-state device, the two BICMOS level shifters are constructed as NOR-type BICMOS level shifters, being disabled by the third control signal C. Thus, the output node 56 is maintained at the tri-state level supplied externally. Namely, when the third control signal C is in a "high" state, PMOS transistors 12A and 12B stop charging to the pull-up bipolar transistors 28A and 28B of respective BICMOS level shifters. Also, the remaining voltage in respective output nodes 40A and 40B is completely discharged through the respective NMOS transistors 26A and 26B. At this time, the remaining voltage in the output nodes 40A and 40B are also discharged through the pull-down bipolar transistors 30A and 30B, thereby performing the discharging operation at a high speed. To maintain the output node 56 at a stable tri-state, the NMOS transistors 44 and 48 maintain at GND the voltage level of the base of the pull-up bipolar transistor 50 and the gate of the pull-down MOS transistor 54. Accordingly, the present invention provides a BICMOS data output buffer which is capable of maintaining the tri-state with low electric power and high speed. This results in a 25% improvement of the operation speed and a 20% reduction of the power consumption as compared to the aforementioned prior art.

Figure 4A:
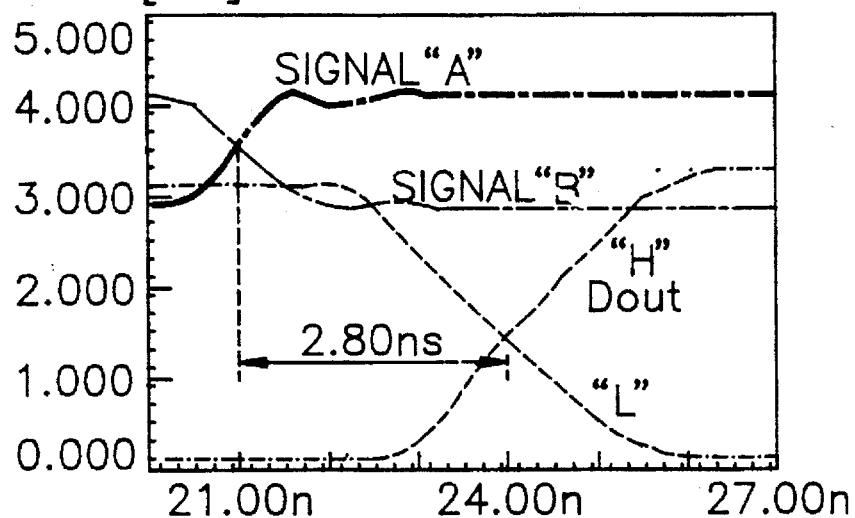
FIG. 4a is a waveform diagram showing the data output characteristic of a conventional data output buffer.
Figure 4B:
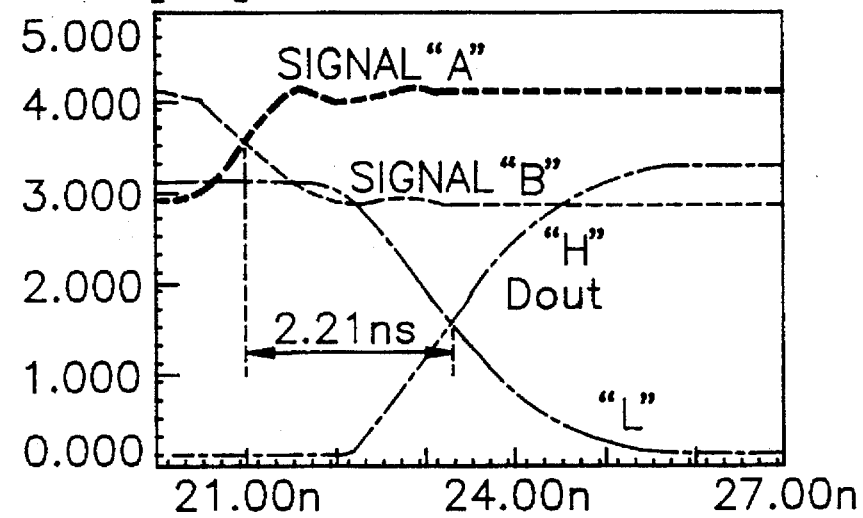
FIG. 4b is a waveform diagram showing the data output characteristic of the data output buffer utilizing the BICMOS level shifter according to the present invention.

FIG. 4a and FIG. 4b, illustrate a simulation made by the present inventor to prove the efficiency of the present invention. FIG. 4a is a waveform diagram showing data output characteristics of the conventional data output buffer, and FIG. 4b is a waveform diagram showing data output characteristics of the data output buffer using the BICMOS level shifter according to the present invention. As shown by a comparison of these figures, the data output buffer of the present invention is enabled at a higher speed by 0.59 ns(n:nano(=$10^{-9}$)) than the conventional data output buffer.

The present invention has been described with respect to the preferred embodiments, but it is not limited to the particular embodiments described above. Various other changes and modifications may be made within the spirit and scope of the present invention. For example, instead of the NOR-type or inverter-type construction of FIG. 1, or FIG. 2, there can be employed a NAND-type construction by modifying the logic of the signals and the transistors. The above descriptions were made in consideration of the input signal having an ECL level, however, other input signals having other levels, such as a MOS level, a TTL level, etc. can be also used to attain the above effect. FIG. 3 shows the data output buffer of a TTL RAM in consideration of the input signals A and B having the ECL level, however, it can be readily predicted by those skilled in the art that this can be applied to the input buffer in case of an ECL RAM.

A level shifter can also be provided that is within the spirit of the present invention, which is capable of being driven only by the input signals and attains the same effect as the level shifters in FIGS. 1 and 2. Such a level shifter can be operated at a higher speed than those in FIGS. 1 and 2, and will be described hereinafter.

Figure 5:
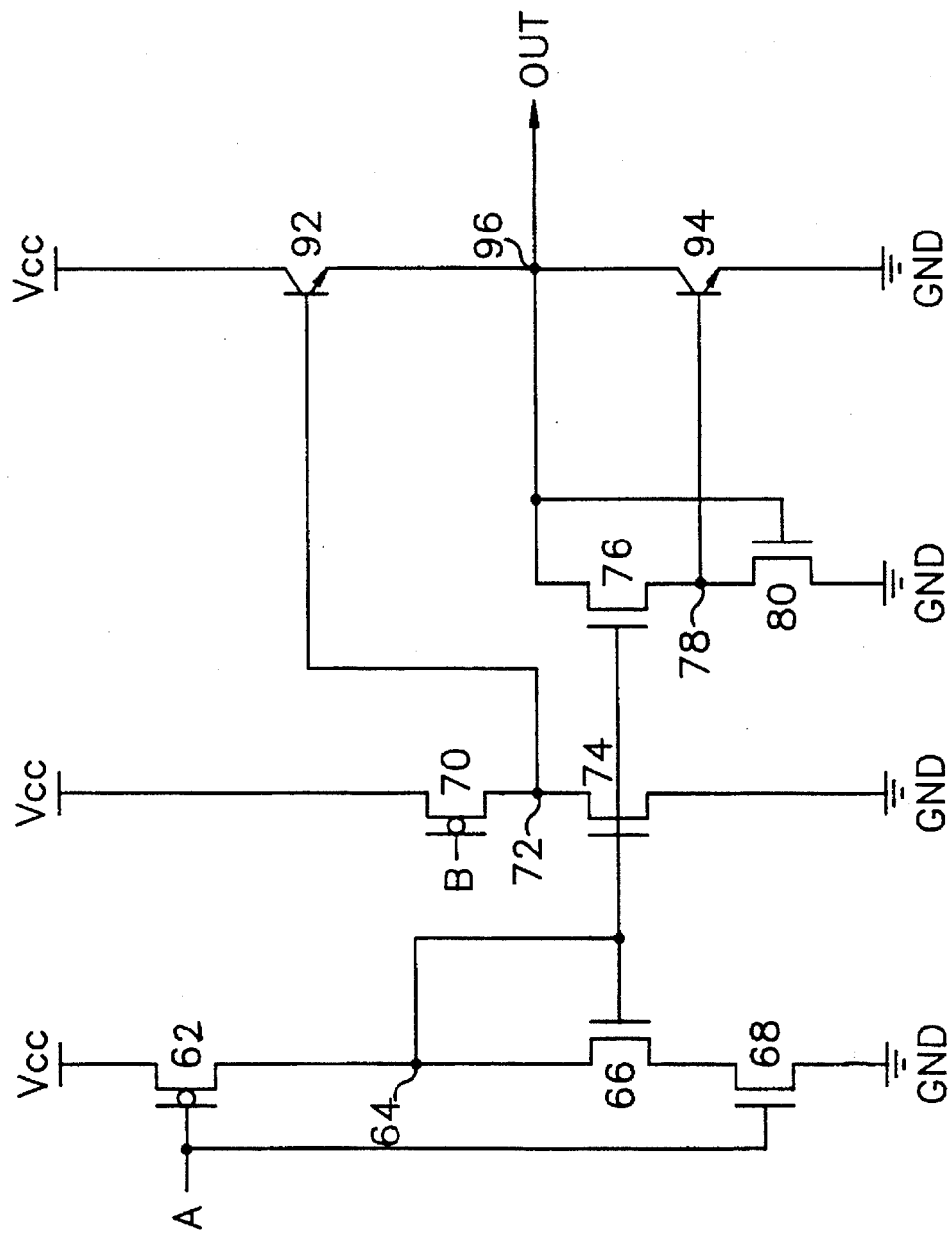
FIG. 5 is a circuit diagram showing a third embodiment of the BICMOS level shifter according to the present invention.

FIG. 5 is a circuit diagram showing a third embodiment of the BICMOS level shifter according to the present invention. FIG. 5 is an inverter-logic circuit as shown in FIG. 2. However, as compared to FIG. 2, FIG. 5 does not have the PMOS transistor 10 the gate of which receives the reference signal REF1, and modifies the NMOS transistor 6 the gate of which receives the reference signal REF2 to the NMOS transistor 68 the gate of which receives the input signal A. The input signal A is commonly applied to the PMOS transistor 62 and NMOS transistor 68 of the input circuit of the level shifter. Therefore, due to the PMOS transistor 62 and NMOS transistor 68 having their gates receiving the input signal A, the generation of the direct current flowing from Vcc to GND is suppressed. In addition, between the channels of the PMOS transistor 62 and NMOS transistor 68, the channel of the NMOS transistor 66 is connected, the drain and gate of NMOS transistor 66 being commonly coupled, thereby suppressing the generation of direct current.

The operation of the FIG. 5 circuit will now be described. If the voltage level of the input signal A is lower than that of the signal B, the PMOS transistor 62 is rendered conductive and charge is thus accumulated at the gates of the NMOS transistors 66 and 74. At this time, the NMOS transistor 68 controlled by the signal A having a low level is in a nonconductive state, thereby controlling the direct current flowing through the NMOS transistor 66. The voltage at the connection node 64 can be thus charged to a "high" level at a high speed. On the other hand, if the voltage level of the signal A is higher than that of the signal B, the PMOS transistor 62 is rendered nonconductive and the NMOS transistor 68 controlled by the signal A(which is in a high level) becomes conductive. This results in the charge at the connection node 64, i.e. at the gate of the NMOS transistors 66 and 74 being discharged at a high speed through the NMOS transistors 66 and 68. That is, by changing the direct current to the switching current, the circuit of FIG. 5 improves the conductive/nonconductive characteristics of the NMOS transistors 74 and 76, while reducing the power consumption, so that the pull-up and pull-down bipolar transistors 92 and 94 are operated at a high speed.

Figure 6:
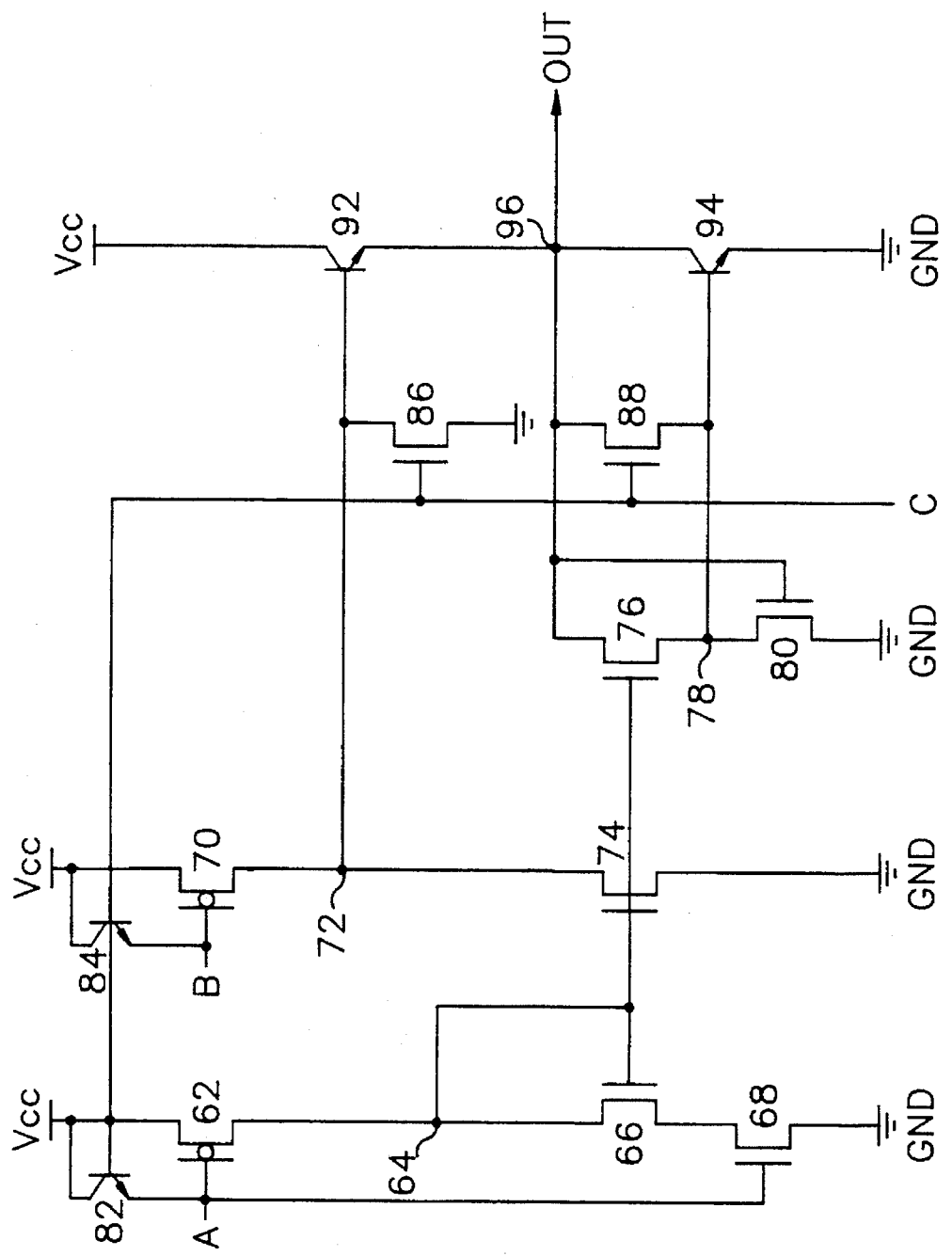
FIG. 6 is a circuit diagram showing a fourth embodiment of the BICMOS level shifter according to the present invention.

FIG. 6 is a circuit diagram showing a fourth embodiment of the BICMOS level shifter according to the present invention. FIG. 6 is a three-input NOR gate receiving the signals A, B and C, with no reference signals REF1 and REF2 being applied thereto and the input circuit being driven only by the signal A. As compared to FIG. 1, FIG. 6 does not have the PMOS transistor 10, and modifies the NMOS transistor 6 to the NMOS transistor 68 the gate of which receives the input signal A. FIG. 6 further includes a the bipolar transistor on the path through which the input signals A and B are supplied. The gate of the PMOS transistor 62 to which the input signal A is applied, is connected to the emitter of the NPN-type bipolar transistor 82 having its collector coupled to Vcc and its base receiving the control signal C. The gate of the PMOS transistor 70 to which the input signal B is applied, is connected to the emitter of the NPN-type bipolar transistor 84 having its collector coupled to Vcc and its base receiving the control signal C. The circuit of FIG. 6 suppresses the generation of the direct current flowing from Vcc to GND by the respective characteristics of the PMOS transistor 62 and NMOS transistor 68 having their gates receiving the signal A as a gate input signal. Also, if the control signal C is applied at a "high" level, the switching operation of the PMOS transistors 62 and 70 can be directly controlled to be nonconductive. The operation according to the input signals A and B is performed in the same way as FIG. 5.

Figure 7:
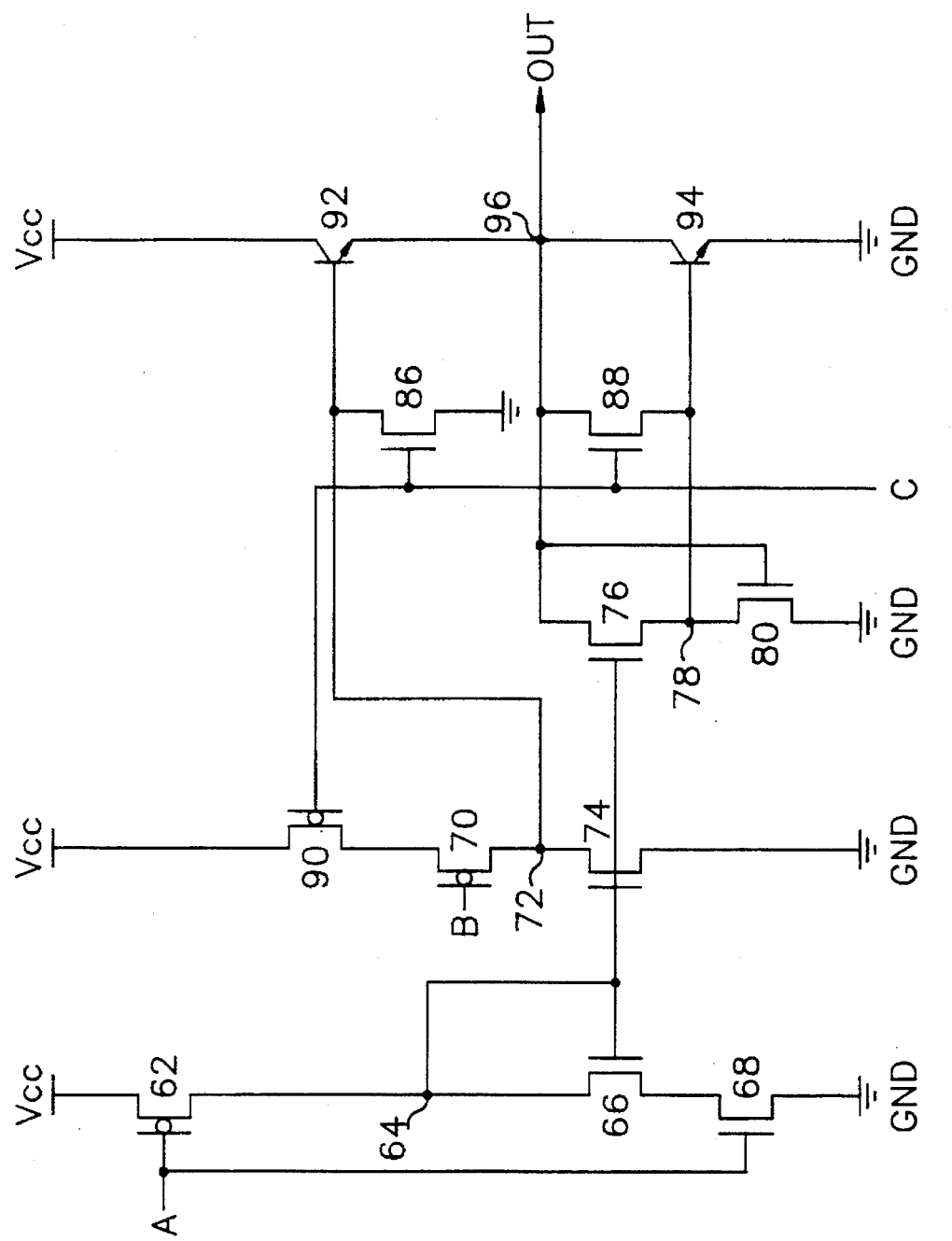
FIG. 7 is a circuit diagram showing a fifth embodiment of the BICMOS level shifter according to the present invention.

FIG. 7 is a circuit diagram showing a fifth embodiment of the BICMOS level shifter according to the present invention, which embodies the NOR gate as shown in FIG. 6. As compared to FIG. 6, FIG. 7 does not have the bipolar transistors on the path of the input signals A and B, and includes the PMOS transistor 90 having its gate receiving the control signal C and its channel connected between Vcc and the PMOS transistor 70. The other construction and operation of the FIG. 7 circuit is essentially the same as that of FIG. 6.

Referring to the above descriptions, while the circuits of FIGS. 1 and 2, to which reference signals having a constant voltage level are applied, control more current than necessary due to the constant reference voltage which is not readily affected by the voltage and temperature, the circuits of FIGS. 5, 6 and 7 operate at a higher speed by using the switching current.

As described above, in order to overcome the limitations of the conventional BICMOS level shifter, the present invention provides BICMOS level shifter having the transistors controlled by the reference signals having the constant voltage level at the pull-up and/or pull-down portions, and the data output buffer utilizing the same. Thereby, it is possible to attain low power consumption, high drive capability and high speed operation by the bipolar transistors and is also possible to cope with unstable input signals.

What is claimed is:

1. A BICMOS level shifter of a semiconductor integrated circuit
    an input circuit for receiving and differentially amplifying first and second input signals to generate first and second amplified output signals, said input circuit including:
        a pull-down transistor formed on a pull-down path of said input circuit to control a pull-down operation of a first output of said input circuit and which is controlled by a first reference signal having a first voltage level, said first amplified output signal being generated on said first output; and
    a pull-up transistor formed on a pull-up path of said input circuit to control a pull-up operation of a second output of said input circuit and controlled by a second reference signal having a second voltage level which has a constant difference from said first voltage level, said second amplified output signal being generated on said second output; and an output circuit for outputting a level shifted signal corresponding to said first and second amplified output signals.

2. A BICMOS level shifter according to claim 1 wherein said pull-up and pull-down transistors are PMOS and NMOS transistors, respectively.

3. A BICMOS level shifter according to claim 2 wherein said output circuit includes a pair of bipolar junction transistors.

4. A BICMOS level shifter according to claim 1 wherein said input circuit further includes an enabling transistor connected between said pull-up transistor and said second output, said enabling transistor having a gate electrode controlled by an enable signal.

5. A BICMOS level shifter according to claim 4 wherein said input circuit further includes:
    a first input transistor which receives said first input signal;
    a second input transistor which receives said second input signal coupled between said second output and said enabling transistor;
    a third transistor coupled between said first input transistor and said pull-down transistor, said third transistor having a gate and source which are electrically connected and serve as said first output; and
    a fourth transistor coupled between said second output and ground.

6. A BICMOS level shifter according to claim 1 wherein said input circuit further includes:
    a first input transistor which receives said first input signal;
    a second input transistor which receives said second input signal coupled between said second output and said pull-up transistor;
    a third transistor coupled between said first input transistor and said pull-down transistor, said third transistor having a gate and source which are electrically connected and serve as said first output; and
    a fourth transistor coupled between first output and ground.

7. A BICMOS level shifter of a semiconductor integrated circuit comprising:
    an input circuit for receiving first and second input signals through respective gates of first and second pull-up transistors and differentially amplifying said input signals to obtain first and second amplified output signals, said input circuit including:
        a pull-down transistor formed on a pull-down path of said input circuit to control a pull-down operation of a first output of said input circuit and controlled by a first reference signal having a first voltage level, said first amplified output signal being generated on said first output;
        a third pull-up transistor formed on a pull-up path of said input part to control a pull-up operation of a second output of said input circuit and controlled by a second reference signal having a second voltage level which has a constant difference from said first voltage level, said second amplified output signal being generated on said second output; and
        a fourth pull-up transistor formed between said second and third pull-up transistors and controlled by an enable control signal; and
    an output circuit for outputting a level shifted signal upon receiving said first and second amplified output signals so that a NOR logic operation is performed in response to said first and second input signals when said control signal is enabled.

8. A BICMOS level shifter according to claim 7 wherein said pull-up and pull-down transistors are PMOS and NMOS transistors, respectively.

9. A BICMOS level shifter according to claim 7 wherein said output circuit includes a pair of bipolar junction transistors.

10. A BICMOS level shifter of a semiconductor integrated circuit comprising:
- a first pull-up transistor with a first pull-up channel for receiving a first input signal;
- a second pull-up transistor with a second pull-up channel for receiving a second input signal;
- a first pull-down transistor with a first pull-down channel serially connected to said first pull-up channel, said first pull-down transistor controlled by a first current supplied from said first pull-up transistor for performing a switching operation;
- a second pull-down transistor with a second pull-down channel serially connected to said first pull-down channel, said second pull-down transistor controlled by said first input signal for pulling down to ground said first current transferred from said first pull-down transistor;
- a third pull-down transistor with a third pull-down channel serially connected to said second pull-up channel, said third pull-down transistor controlled by said second current supplied from said second pull-up transistor for pulling down to ground a second current transferred from said second pull-up transistor; and
- an output circuit for outputting a level shifted signal in response to said first and second currents.

11. A BICMOS level shifter according to claim 10 wherein said first input signal is input to a first pull-up gate of said first pull-up transistor and a second pull-down gate of said second pull-down transistor and second input signal is input to a second pull-up gate of said second pull-up transistor.

12. A BICMOS level shifter according to claim 11 wherein said first pull-down gate is electrically connected to a first pull-down source of said first pull-down transistor.

13. A BICMOS level shifter according to claim 12 wherein said pull-up and pull-down transistors are PMOS and NMOS transistors, respectively.

14. A BICMOS level shifter according to claim 11 wherein said output circuit includes a pair of bipolar junction transistors.

15. A BICMOS level shifter of a semiconductor integrated circuit comprising:
- a first pull-up transistor with a first pull-up channel for receiving a first input signal;
- a first bipolar transistor formed between a power supply voltage and an input path of said first input signal, switching of said first bipolar transistor being controlled by a predetermined control signal;
- a second pull-up transistor with a second pull-up channel for receiving a second input signal;
- a second bipolar transistor formed between said power supply voltage and an input path of said second input signal, switching of said second bipolar transistor being controlled by said predetermined control signal;
- a first pull-down transistor with a first pull-down channel serially connected to said first pull-up channel, for performing a switching operation in response to a first current supplied from said first pull-up transistor;
- a second pull-down transistor with a second pull-down channel serially connected to said first pull-down channel, for pulling down to ground said first current transferred from said first pull-down transistor in response to said first input signal;
- a third pull-down transistor with a third pull-down channel serially connected to said second pull-up channel, for pulling down to ground a second current transferred from said second pull-up transistor in response to said second current supplied from said second pull-up transistor; and
- an output circuit for outputting a level shifted signal in response to said first and second currents when said predetermined control signal is enabled, so that a NOR logic operation is performed in response to said first and second input signals when said predetermined control signal is enabled.

16. A BICMOS level shifter according to claim 15 wherein said pull-up and pull-down transistors are PMOS and NMOS transistors, respectively.

17. A BICMOS level shifter according to claim 16 wherein said output circuit includes a pair of bipolar junction transistors.

18. A data output buffer comprising:
- a first BICMOS level shifter pull-up control circuit which receives first and second input signals and generates a pull-up output signal;
- a second BICMOS level shifter pull-down control circuit which receives said first and second input signals and generates a pull-down output signal; and
- a data buffer output circuit which inputs said pull-up output signal and said pull-down output signal to generate a data buffer output signal.

19. A data output buffer according to claim 18 wherein said first BICMOS level shifter includes:
- a first input circuit which receives said first and second input signals through respective gates of first and second pull-up transistors and then differentially amplifies said first and second input signals to generate first and second amplified output signals, said first input circuit further including:
  - a third pull-up transistor formed on a pull-up path of said first input circuit to control a pull-up operation of a first output of said first input circuit and controlled by a first reference signal having a first voltage level, said first amplified output signal being generated on said first output;
  - a first pull-down transistor formed on a pull-down path of said first input circuit to control a pull-down operation of a second output of said first input circuit and controlled by a second reference signal having a second voltage level which has a constant difference from said first voltage level, said second amplified output signal being generated on said second output; and
  - a fourth pull-up transistor formed between said second and third pull-up transistors and controlled by an enable control signal; and
- a first output circuit for outputting said pull-up output signal upon receiving said first and second amplified output signals so that a NOR logic operation is performed in response to said first and second input signals when said control signal is enabled; and said second BICMOS level shifter includes:
- a second input circuit which receives said first and second input signals through respective gates of fifth and sixth pull-up transistors and then differentially amplifies said first and second input signals to generate third and fourth amplified output signals, said second input circuit further including:

a seventh pull-up transistor formed on a pull-up path of said second input circuit to control a pull-up operation of a third output of said second input circuit and controlled by said first reference signal, said third amplified output signal being generated on said third output;

a second pull-down transistor formed on a pull-down path of said second input circuit to control a pull-down operation of a fourth output of said second input circuit and controlled by said second reference signal, said fourth amplified output signal being generated on said fourth output; and an eighth pull-up transistor formed between said sixth and seventh pull-up transistors and controlled by said enable control signal; and a second output circuit for outputting said pull-down output signal upon receiving said third and fourth amplified output signals so that a NOR logic operation is performed in response to said first and second input signals when said control signal is enabled.

20. A data output buffer according to claim 19 wherein said data buffer output circuit further includes:

an output pull-up transistor formed between a first source voltage and an output node and controlled by said pull-up output signal; and an output pull-down transistor formed between a second source voltage and said output node and controlled by said pull-down output signal.

21. A data output buffer according to claim 19 wherein said first BICMOS level shifter further includes a first output transistor connected between a first voltage source and a pull-up output which outputs said pull-up output signal, said first output transistor controlled by said first input signal; and said second BICMOS level shifter further includes a second output transistor connected between a pull-down output which outputs said pull-down output signal and a second voltage source, said second output transistor controlled by said second input signal.

22. A data output buffer according to claim 21 wherein said first output transistor is a PMOS transistor and said second output transistor is an NMOS transistor.

* * * * *